(12) United States Patent
Burns et al.

(10) Patent No.: US 7,316,325 B2
(45) Date of Patent: Jan. 8, 2008

(54) SUBSTRATE CONTAINER

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 462 days.

(21) Appl. No.: 10/982,401

(22) Filed: Nov. 5, 2004

(65) Prior Publication Data

US 2005/0109669 A1 May 26, 2005

Related U.S. Application Data

(60) Provisional application No. 60/518,188, filed on Nov. 7, 2003.

(51) Int. Cl.
*A47G 19/08* (2006.01)
(52) U.S. Cl. .................................................. 211/41.18
(58) Field of Classification Search .............. 211/40, 211/41.18; 206/710, 711, 454, 832, 833; 414/935–941; 118/500
See application file for complete search history.

(56) References Cited

U.S. PATENT DOCUMENTS

| 4,718,552 | A  | * | 1/1988  | Rossi et al. ............... 206/308.3 |
|-----------|----|---|---------|---------------------------------------|
| 5,780,127 | A  |   | 7/1998  | Mikkelsen                             |
| 5,785,186 | A  |   | 7/1998  | Babbs et al.                          |
| 5,816,410 | A  |   | 10/1998 | Nyseth                                |
| 6,216,874 | B1 |   | 4/2001  | Bores et al.                          |
| 6,428,729 | B1 |   | 8/2002  | Bhatt et al.                          |
| 6,499,602 | B2 |   | 12/2002 | Yajima et al.                         |
| 6,513,654 | B2 |   | 2/2003  | Smith et al.                          |
| 7,121,414 | B2 | * | 10/2006 | Beckhart et al. ......... 211/41.18   |
| 2001/0037986 | A1 | * | 11/2001 | Mendiola ................. 211/41.18 |
| 2001/0042697 | A1 | * | 11/2001 | Yajima et al. .............. 206/454 |
| 2002/0005369 | A1 | * | 1/2002  | Nyseth et al. .............. 206/711 |
| 2003/0121870 | A1 | * | 7/2003  | Beckhart et al. ......... 211/41.18  |
| 2005/0173358 | A1 | * | 8/2005  | Oyama ..................... 211/41.18 |

* cited by examiner

*Primary Examiner*—Jennifer E. Novosad
(74) *Attorney, Agent, or Firm*—Patterson, Thuente, Skaar & Christensen, P.A.

(57) ABSTRACT

A substrate carrier to dissipate electrostatic charge has a conductive grid or network overmolded in a substantially integral container. The grid is electrically connected to an underlying and grounded saddle. The carrier may further include substantially transparent side walls and electrically conductive shelves to retain stored substrates in a generally axial alignment.

11 Claims, 4 Drawing Sheets

SUBSTRATE CONTAINER

CROSS-REFERENCES TO RELATED APPLICATIONS

This application claims priority under 35 U.S.C. § 119(e) to, and hereby incorporates by reference, U.S. Provisional Application No. 60/518,188, filed 7 Nov. 2003.

FIELD OF THE INVENTION

This invention relates to devices for confining, silicon wafers, memory disks and the like for transport, storage and processing. More particularly, this invention relates to a substrate container with electrostatic protective features.

BACKGROUND

Substrate carriers are utilized for holding, transporting and storing substrates, before during and after processing. Examples of such substrates are wafers for use in fabrication of semiconductor devices, magnetic storage disk substrates, substrates for liquid-crystal display panels and the like. Before they can be transformed into the end product, these delicate and valuable substrates are subjected to repeated processing, storage and transport. It is well known that semiconductor wafers are highly susceptible to damage from environmental influences, such as, particulates, electrostatic discharges, jarring and gaseous containments.

Contaminants in the form of dust and other particulates from the ambient atmosphere can irretrievably compromise a substrate should they adhere to it. As the size of an integrated circuitry has continued to shrink, the size of particles which can contaminate an integrated circuit has also become smaller, thereby making minimization of contaminants all the more critical. The semiconductor industry employs elaborate measures such as clean rooms to prevent just such an occurrence. Contamination is accepted as the single biggest cause of yield loss in the semiconductor industry.

Contaminants in the form of particles may be generated by abrasion, such as rubbing or scraping the carrier with the wafers or disks, with the carrier covers or enclosures, with storage racks, with other carriers, or with the processing equipment. A most desirable characteristic of a carrier is therefore a resistance to particle generation upon abrasion, rubbing, or scraping of the plastic molded material. U.S. Pat. No. 5,780,127 discusses various characteristics of plastics which are pertinent to the suitability of such materials for wafer carriers. Said patent is hereby incorporated by reference.

In light of the above, the necessity to protect substrates at each step of the fabrication process becomes obvious. One purpose of a wafer carrier is to provide this protection. An example of a wafer carrier is a Front Opening Unified Pod system (FOUP), such as the F300 Wafer Carrier manufactured by Entegris. A FOUP provides a protective enclosure to shield the wafers from dust particles in the atmosphere or from chemical contamination during fabrication, transfer, transport or storage.

A second purpose of a wafer carrier is to securely hold the wafer disks during transport. Carriers are generally configured to axially arrange the wafers or disks in slots and to support the wafers or disks by or near their peripheral edges. The wafers or disks are conventionally removable from the carriers in a radial direction upwardly or laterally. Commonly assigned U.S. Pat. No. 6,428,729 discloses a wafer carrier configured as a process enhancement carrier provide with wafer support shelves. This patent is hereby incorporated by reference.

Additionally, because processing wafer disks is generally automated, it is necessary for disks to be precisely positioned relative to the processing equipment for the robotic removal and insertion of the wafers. Prior art wafer carriers, such as those utilizing multiple component parts, can have undesirable variations in critical dimensions caused by the stacking of tolerances of the component plastic parts. In order to overcome the difficulty in producing wafer carriers with acceptable tolerances between the wafer planes and external processing equipment interfaces, monolithic wafer carriers have been employed in the art.

The material used for the carrier shell must be such that the carrier maintains its dimensional stability during its product life cycle despite the repeated process and transport induced stresses on the carrier. Dimensional stability is necessary to prevent damage to the wafers or disks and to minimize movement of the wafers or disks within the carrier. The tolerances of the slots holding wafers and disks are typically quite small and any deformation of the carrier can directly damage the highly brittle wafers or can increase the abrasion and thus the particle generation when the wafers or disks are moved into, out of, or within the carrier. Dimensional stability is also extremely important when the carrier is loaded in some direction such as when the carriers are stacked during shipment or when the carriers integrate with processing equipment. The carrier material should also maintain its dimensional stability under elevated temperatures which may be encountered during storage or cleaning.

In handling and processing semiconductor wafers, static electricity is a continuing concern. Conventional carriers used in the semiconductor industry may develop and retain static charges. When a charged plastic part comes into contact with an electronic device or processing equipment, it may discharge in the damaging phenomena of electrostatic discharge (ESD). Therefore, it is desirable to have a carrier with static dissipation characteristics to eliminate ESD as well as to avoid attracting particles. Wafer carriers have been manufactured with conventional static dissipative materials such as carbon filled polyetheretherketone (PEEK) and carbon filled polycarbonate (PC).

Visibility of wafers within closed containers is highly desirable and may be required by end users. Transparent plastics, such as polycarbonates, have been employed for this purpose because such plastics are low in cost. However, they do not have desirable static dissipative characteristics or desirable abrasion resistance.

Carriers are typically formed of injection molded plastics such as polycarbonate (PC), acrylonitrile butadiene styrene (ABS), polypropylene (PP), polyethylene (PE), perfluoroalkoxy (PFA), and polyetheretherketone (PEEK). It must be recognized that a material that is ideal for one carrier function is typically not the ideal material for a different function of the same carrier. For example, PEEK is a material that has ideal abrasion resistance characteristics for wafer contact portions, but is difficult to mold and cost prohibitive relative to other plastics.

Fillers may also be added to injection molded plastics for static dissipation. Such fillers include carbon powder or fiber, metal fibers, metal coated graphite, and organic (amine-based) additives. U.S. Pat. No. 6,428,729 teaches composite substrate carriers, especially wafer carriers formed from at least two different melt processible plastic materials in which the two plastic materials are strategically positioned for optimal performance.

It should be stressed that one of the important considerations in designing a wafer carrier is the cost of the materials used in the construction of the carrier and the ease of molding the material.

SUMMARY OF THE INVENTION

A substrate carrier is disclosed that includes a container portion with an internal cavity for protective containment of substrates during processing, transport and support. The container portion has a unique means for protecting the carrier from building up static charges as well as combinations of materials providing optimal performance characteristics. In a preferred embodiment, the wafers are supported on side support columns extending from the walls of the container portion and integrally molded such as by overmolding. Visible access to wafers within the closed pod is facilitated by transparent portions which can essentially be the entire shell or by windows formed by overmolding into the container. Pathways configured as arrays of conductive materials are created using the overmolding process which may span the windows or transparent portions of the shell, the side wafer support columns as well as the pod shell. The conductive materials may form physical barriers protruding from the transparent portions to prevent or minimize physical contact with transparent portions by handlers or objects.

In preferred embodiments, an advantage and feature is that a series of spaced conductive pathways are formed on the exterior of a wafer container shell. The series can be arranged as an array including a grid to effectively cover particular transparent portions, especially those that are amenable to contact with objects that might have a static charge or that might create a charge by said contact.

DETAILED DESCRIPTION

Figure 1:
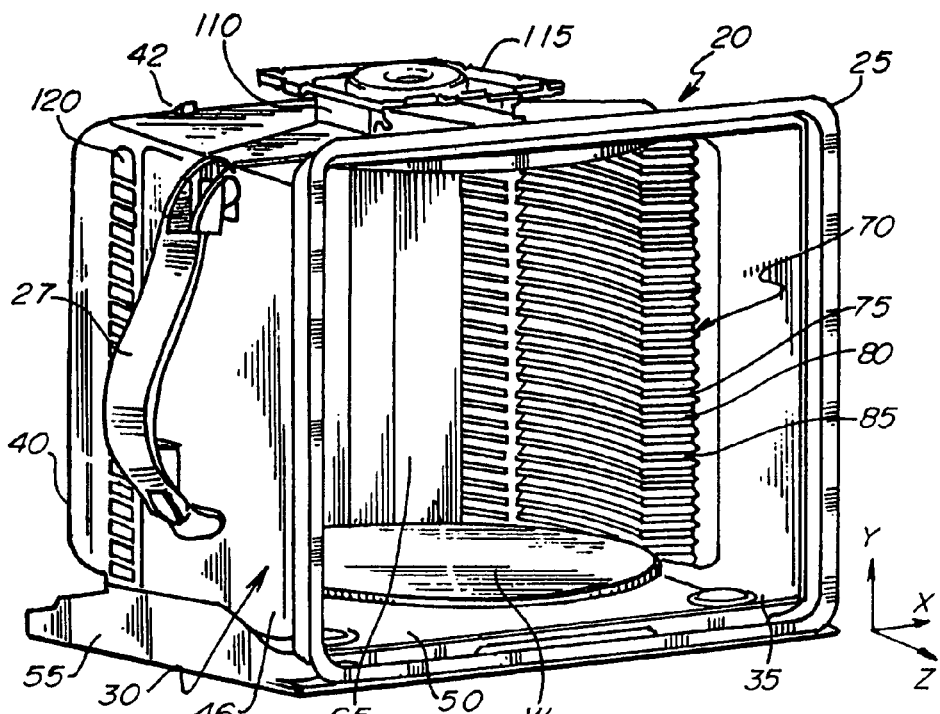
FIG. 1 is a perspective view of a container portion of a wafer carrier of the instant invention.

Referring to FIG. 1, a container module or FOUP for wafers generally designated with the numeral 20, has a container portion 25 with a lift-saddle 27, and a door 28 closing the container 25 (FIG. 6) and secured therein by a latch mechanism 29.

Figure 2:
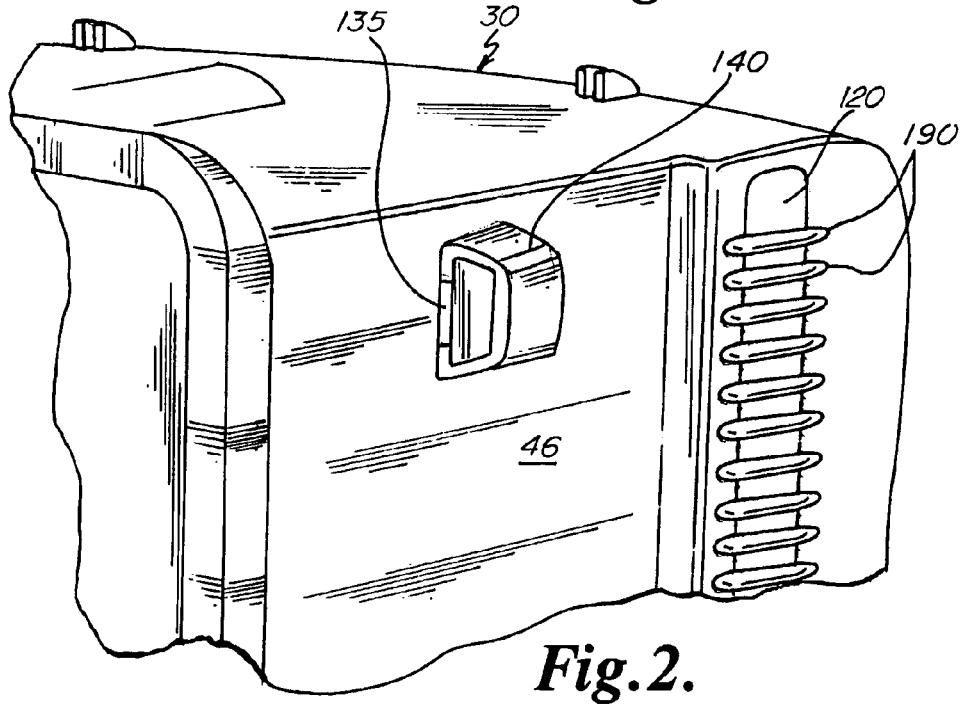
FIG. 2 is a perspective view of wafer support columns.
Figure 3:
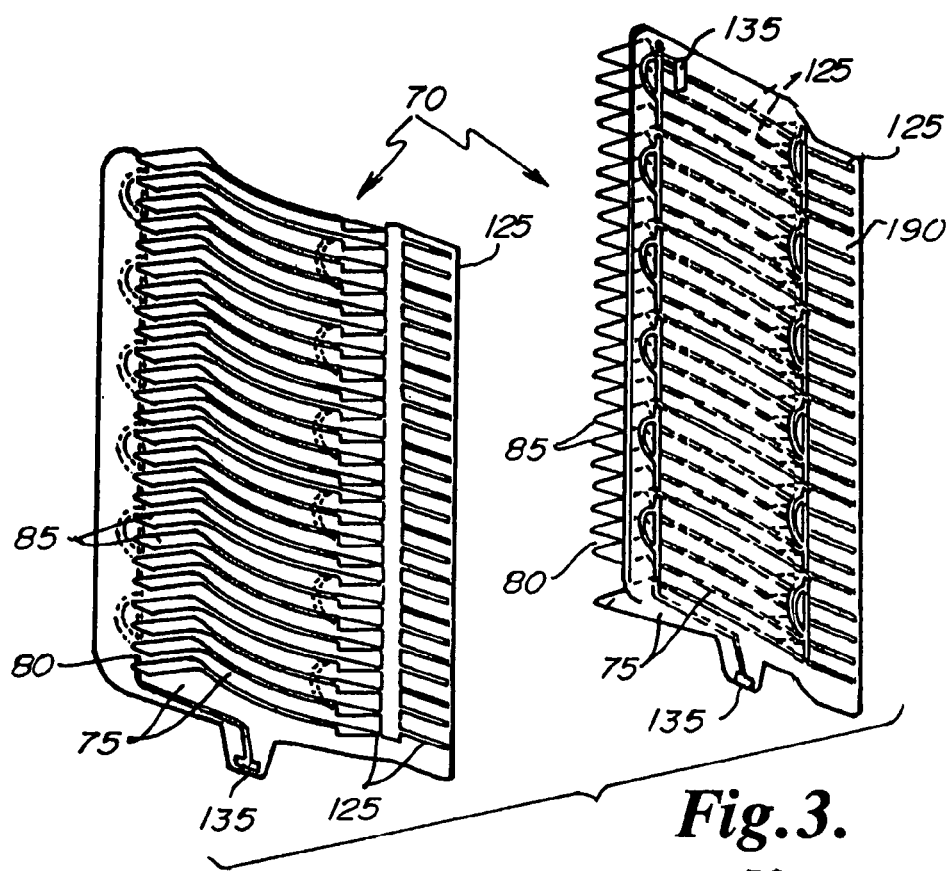
FIG. 3 is a view of a portion of the wafer carrier depicting a conductive tab on the side wall of the wafer carrier.

As shown in FIG. 1, the FOUP shell generally designated with the numeral 20 is principally comprised of a pod shell 30 with a front 35, a back 40, a top wall 42, side walls 45, 46, and a bottom 50. The pod shell is supported on a conductive, grounded plate 55, the bottom 50 being in contact relationship with grounded plate 55. In a preferred embodiment, the conductive plate 55 is electrically grounded and is designed with three interface structures, configured as grooves 56, that comprise a kinematic coupling 57 illustrated in FIG. 4. The side walls 45, 46 are continuous and solid. FIGS. 1 and 2 show the open interior 65 of the container. Integral with the side walls 45, 46 are a pair of wafer side columns 70, each of which comprise a plurality of shelves 75 and define a wafter receiving region 80, each shelf having wafer engagement portions 85. In a preferred embodiment, the top wall 42 is provided with guide ribs 110 suitable for slidably receiving a robotic-flange 115 for grasping and hoisting the pod by means of an overhead hoist transfer section (OHT) (not shown).

In a preferred embodiment, the pod shell 30 is preferably injection molded from polycarbonate or polyetherimide or the like. Generally, if the pod is fabricated from an opaque material, a sight window 120 is desirably molded into the pod shell 30. The window 120 is preferably comprised of a substantially transparent or translucent material. Generally, each side wall 45, 46 may be provided with a substantially transparent window which allows visual access to the wafers inside the opaque pod shell 30.

Figure 5:
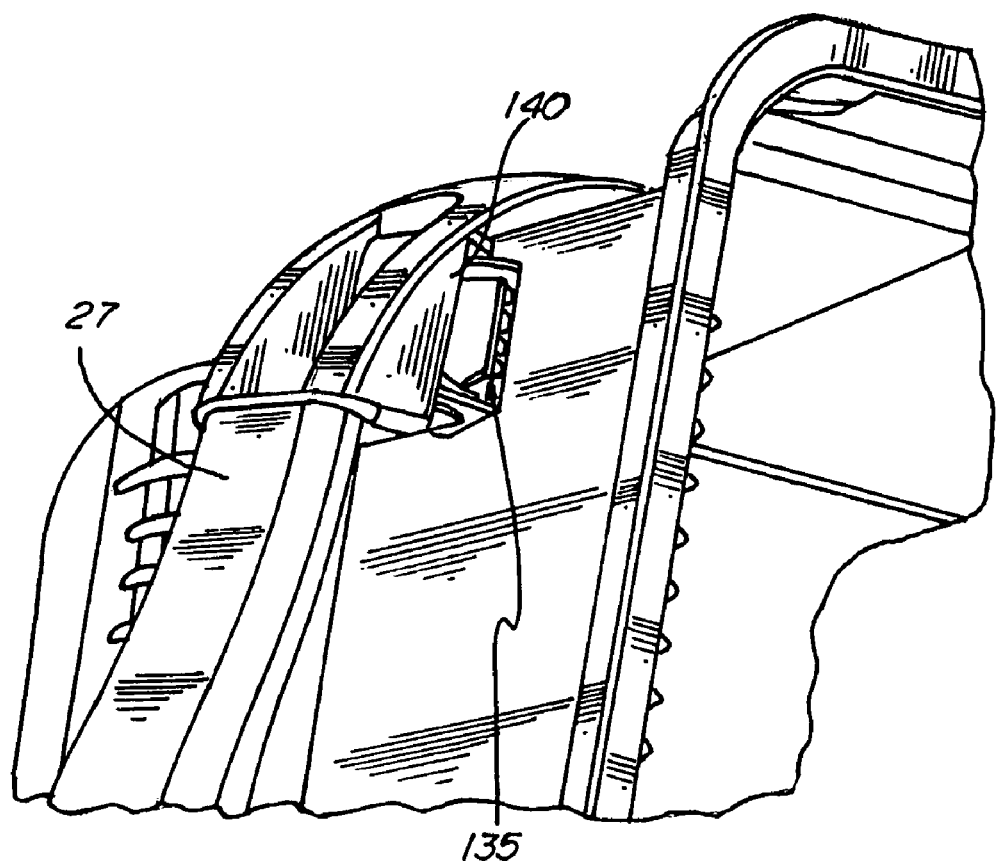
FIG. 5 is a detail of the connection of the conductive views in the wafer supports with the handles.

In another preferred embodiment, the side columns 70 are integrally injection molded with the pod shell so that the pod shell and the side columns comprise a monolithic body. The side columns 70 may have overmolded conductive artery portions 125 of a static dissipative material (SDM) such as carbon filled PEEK as exemplified in FIG. 2. The artery portions, as is depicted in FIG. 2, form an electrically conductive pathway connecting the top wall 42 to the bottom 50 and the conductive, grounded plate 55. In another embodiment shown in FIG. 5, the conductive artery may be electrically coupled with conductive pads 135 molded into and protruding from the side walls 45, 46 at locations 140, 141 which form points of attachment of a load-distributing lift-saddle 27 to the side wall. The conductive pathways are arranged in an array which can include a grid with repeating pathways separated by the transparent material of the shell. It is believed that separation of the conductive pathways by about ½ of an inch to about an inch and ½. The lift-saddle 27 is articulated with the robotic-flange 115 and serves to distribute the load from the robotic-flange 115 to the side walls 45, 46. The interconnection of the lift-saddle with the conductive pads 135 effectively provides an electrical pathway to ground electrostatic charges that might accumulate on the robotic-flange 115 during operation.

"Conductive" herein means the component or vein or material is at least static dissipative and can discharge a static buildup as is typically seen in the context of wafer containers. Generally be static dissipative the material has a surface resistivity in the range of $10^5$ to $10^{12}$ ohms per square. For a material to provide a conductive path to ground, resistance less than this may be appropriate.

Figure 4:
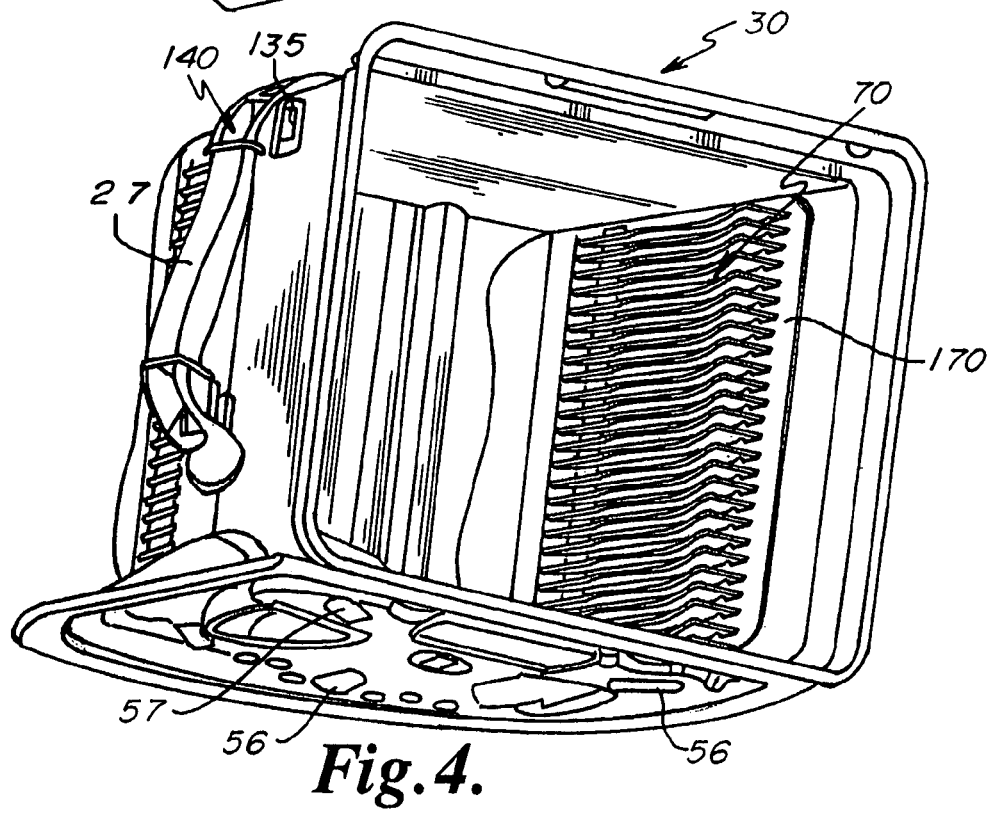
FIG. 4 is a perspective view of a container portion of a wafer carrier of the instant invention.

In an alternate embodiment, the window 120 as well as the side columns 70 may have an overmolded conductive rib array 170 having conductive ribs 190, as shown in FIG. 4. The conductive rib array 170 may be ideally formed by overmolding from carbon filled PEEK or similar materials which provide a static dissipative feature. However, because the rib array spans a much larger extent of the area of the side walls 45, 46, it provides a means to ground electrostatic charges over an extended area of the pod shell 30 by using a minimum amount of cost-prohibitive SDM material such as PEEK. Moreover, in preferred embodiments the rib array may provide a physical barrier to contact the window or other critical portion of the carrier. The arrays described herein can be flush with the outwardly facing transparent surface, embedded below the surface, or protruding outwardly from the outwardly facing transparent surface. The protruding configuration provides the physical barrier.

Figure 6:
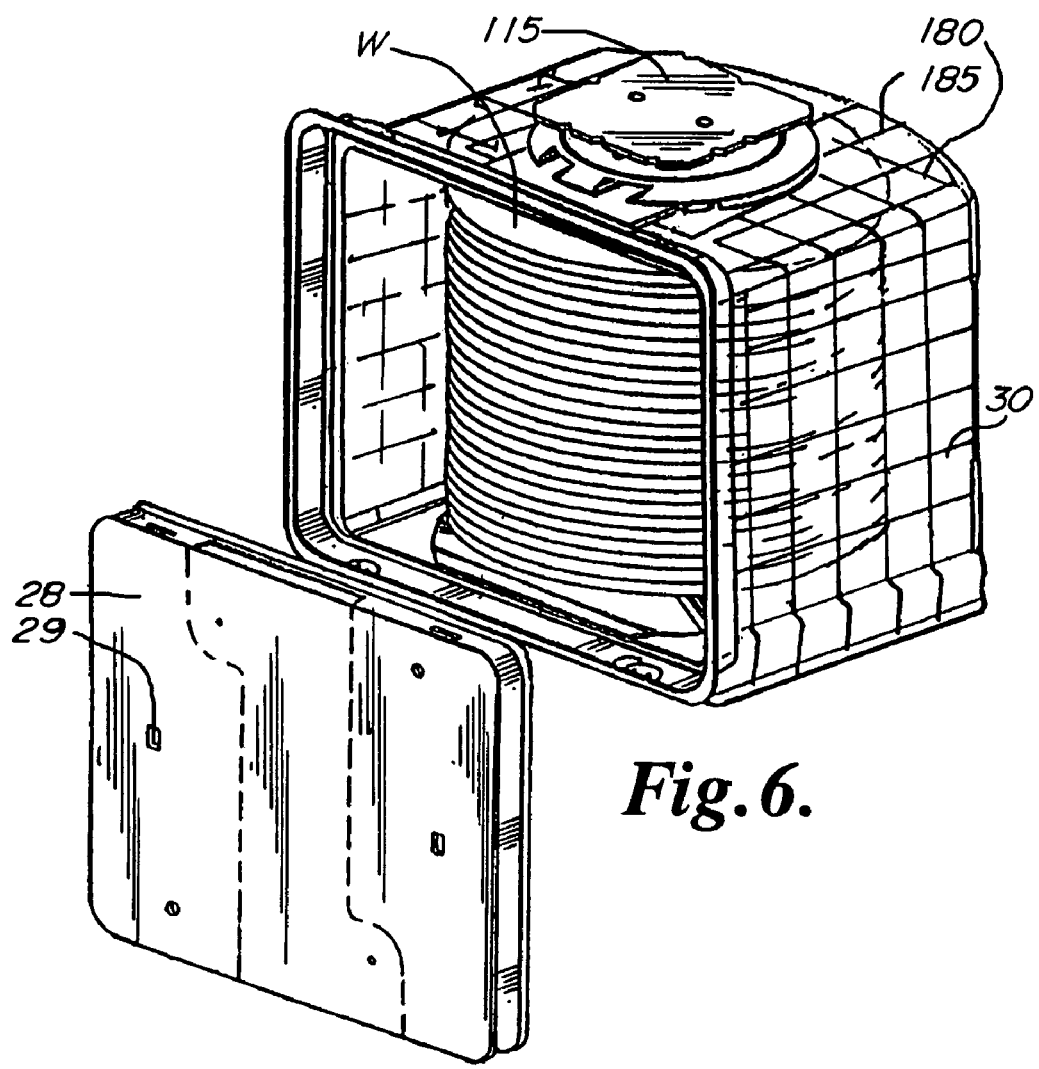
FIG. 6 is a perspective view of a wafer container of the instant invention.
Figure 7:
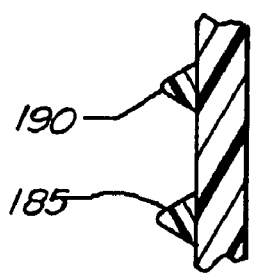
FIG. 7 is a cross-sectional view of a window portion with an array of ribbing protruding therefrom of the instant invention.
Figure 8:
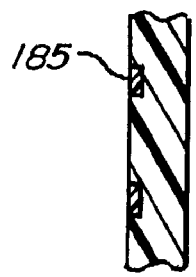
FIG. 8 is a cross-sectional view of a window portion with a grid of conductive material molded therein of the instant invention.

Referring to FIG. 6, in another alternate embodiment, a conductive grid network 180 is overmolded over substantially all of the transparent pod shell 30. The array or grid includes conductive material 185 and may be adapted to provide a path-to-ground for electrostatic charges at any desired portion of the pod. It will be appreciated that the reticulation of the array or grid may be non-uniform, with a finer mesh or with a more dense distribution of mesh on areas of the pod more susceptible to electrostatic charge accumulation. The array or grid may include a repetitive series of conductive lines optionally exposed on the exterior of the shell. The grid 180, e.g., may be a rectilinear or non-rectilinear or curvilinear or noncurvilinear shell 30 and may be molded first and then placed back into an injection mold to mold a PEEK grid 170 over it. In this process the mold temperature is ideally kept below the glass transition temperature of polycarbonate which is approximately 149° C. to prevent distortion of the polycarbonate base portion. FIGS. 7 and 8 show the conductive material 185 in side wall cross section at the ribbing and a window, respectively.

In particular applications, it may be suitable to have the first injection molded portion, i.e. the grid portion, to be relatively smaller volumetrically than the second, overmolded portion, the pod shell. In other applications, a first material, comprising, for example, a conductive grid, may be deposited at critical positions in a mold—for example, the wafer contact areas and the window areas—the material is allowed to solidify, and a second portion, such as the polycarbonate comprising the material of the pod shell, is overmolded onto the first material without changing molds.

In other particular applications, the second material does not have to be allowed to solidify, the two materials may join while both are molten. This coinjection molding may not offer the precision in locating the interface between the first portion and the second portion; it does, however, eliminate the need for the extra mold and the steps of allowing the first portion to solidify, removing the portion from the mold, and placement of the first portion in a second mold.

The present invention may be embodied in other specific forms without departing from the spirit or essential attributes thereof, and it is therefore desired that the present embodiment be considered in all respects as illustrative and not restrictive to the foregoing description to indicate the scope of the invention.

What is claimed:

1. A substrate container, comprising a door and a container portion:
    the container portion comprising pair of generally opposed side walls, each of said side walls including a transparent portion exposed for viewing said substrates when said substrates are in said container;
    a rear wall;
    a top wall
    a bottom,
    a pair of generally opposed side columns, one of said side columns extending inwardly from each of said side walls, each of said side columns defining shelves accommodating said substrates, said side walls, said rear wall, and said bottom defining a space accommodating said substrate; and
    a repetitive array of substantially continuous and discrete electrically conductive material extending across an exteriorly facing surface of said transparent portion providing a path-to-ground for dissipating static electricity.

2. The container of claim 1, wherein the repetitive array is configured as a grid.

3. The container of claim 2, in which said grid is generally uniform.

4. The container of claim 2, in which said grid is rectilinear.

5. The container of claim 1, in which said array is in electrical communication with said shelves.

6. The container of claim 5, in which said array is further present in said top wall.

7. The container of claim 6, in which said array is further present in said bottom.

8. The container of claim 1, further comprising an electrically conductive artery present in said side walls electrically connecting said top wall and said bottom.

9. The container of claim 1, in which said shelves are electrically conductive.

10. The container of claim 1, in which said container is principally comprised of polycarbonate.

11. The container of claim 1, in which said shelves are electrically conductive.

* * * * *

UNITED STATES PATENT AND TRADEMARK OFFICE
CERTIFICATE OF CORRECTION

| | | |
|---|---|---|
| PATENT NO. | : 7,316,325 B2 | Page 1 of 1 |
| APPLICATION NO. | : 10/982401 | |
| DATED | : January 8, 2008 | |
| INVENTOR(S) | : John Burns et al. | |

It is certified that error appears in the above-identified patent and that said Letters Patent is hereby corrected as shown below:

Col. 2, line 1. "provide" should be – "provided".

Col. 4, line 50. "Generally be static dissipative the material has ..." should be "Generally, to be static dissipative ...".

Signed and Sealed this
Sixth Day of December, 2011

David J. Kappos
*Director of the United States Patent and Trademark Office*